United States Patent
Lunsman et al.

(10) Patent No.: US 10,188,016 B2
(45) Date of Patent: Jan. 22, 2019

(54) NODE BLIND MATE LIQUID COOLING

(71) Applicant: HEWLETT PACKARD ENTERPRISE DEVELOPMENT LP, Houston, TX (US)

(72) Inventors: Harvey Lunsman, Chippewa Falls, WI (US); Steven J. Dean, Chippewa Falls, WI (US); Roger Ramseier, Chippewa Falls, WI (US); Russell Stacy, Chippewa Falls, WI (US)

(73) Assignee: HEWLETT PACKARD ENTERPRISE DEVELOPMENT LP, Houston, TX (US)

( * ) Notice: Subject to any disclaimer, the term of this patent is extended or adjusted under 35 U.S.C. 154(b) by 0 days.

(21) Appl. No.: 15/339,483

(22) Filed: Oct. 31, 2016

(65) Prior Publication Data

US 2017/0127575 A1 May 4, 2017

Related U.S. Application Data

(60) Provisional application No. 62/249,038, filed on Oct. 30, 2015.

(51) Int. Cl.
  *F16L 37/12* (2006.01)
  *H05K 7/20* (2006.01)
  *F16L 37/35* (2006.01)

(52) U.S. Cl.
  CPC .......... *H05K 7/20772* (2013.01); *F16L 37/12* (2013.01); *H05K 7/20263* (2013.01); *F16L 37/35* (2013.01)

(58) Field of Classification Search
  CPC .. F16L 37/12; F16L 37/35; G06F 1/20; G06F 2200/201; H05K 7/20; H05K 7/20772;
  (Continued)

(56) References Cited

U.S. PATENT DOCUMENTS 7,639,499 B1 * 12/2009 Campbell .......... H05K 7/20772
  165/104.19
8,351,206 B2 * 1/2013 Campbell .......... H05K 7/20809
  361/691

(Continued)

FOREIGN PATENT DOCUMENTS

| WO | WO 2015/084325 | 6/2015 |
| WO | WO 2017/075632 | 5/2017 |
| WO | WO 2017/075633 | 5/2017 |

OTHER PUBLICATIONS

U.S. Appl. No. 15/339,451, Harvey Lunsman, Configurable Node Expansion Space, Oct. 31, 2016.

(Continued)

*Primary Examiner* — Timothy Thompson
*Assistant Examiner* — Guillermo Egoavil
(74) *Attorney, Agent, or Firm* — Hewlett Packard Enterprise Patent Department

(57) ABSTRACT

The present disclosure is directed to a configurable extension space for a computer server or node blade that has the ability to expand data storage or other functionality to a computer system while minimizing any disruption to computers in a data center when the functionality of a computer server or a node blade is extended. Apparatus consistent with the present disclosure may include multiple electronic assemblies where a first assembly resides deep within an enclosure to which an expansion module may be attached in an accessible expansion space. Such apparatus may also include liquid cooling.

20 Claims, 7 Drawing Sheets

(58) Field of Classification Search
CPC .......... H05K 7/20263; H05K 7/20836; H05K 7/20327; H05K 7/20781
USPC ............... 174/31.5; 361/687, 679.53, 679.47
See application file for complete search history.

(56) References Cited

U.S. PATENT DOCUMENTS

| | | | | |
|---|---|---|---|---|
| 8,619,425 | B2* | 12/2013 | Campbell | .......... H05K 7/20809 |
| | | | | 165/80.4 |
| 2006/0002080 | A1* | 1/2006 | Leija | .................. H05K 7/20772 |
| | | | | 361/679.46 |
| 2006/0065874 | A1 | 3/2006 | Campbell et al. | |
| 2006/0082970 | A1* | 4/2006 | Walz | .................. H05K 7/20645 |
| | | | | 361/699 |
| 2006/0187638 | A1* | 8/2006 | Vinson | ...................... G06F 1/20 |
| | | | | 361/698 |
| 2008/0137284 | A1 | 6/2008 | Flynn et al. | |
| 2008/0212276 | A1 | 9/2008 | Bottom et al. | |
| 2009/0262495 | A1* | 10/2009 | Neudorfer | ................. G06F 1/20 |
| | | | | 361/679.47 |
| 2009/0273897 | A1 | 11/2009 | Tang et al. | |
| 2010/0101765 | A1 | 4/2010 | Campbell et al. | |
| 2015/0230360 | A1* | 8/2015 | Canfield | .............. H05K 7/1417 |
| | | | | 361/679.58 |
| 2016/0270267 | A1* | 9/2016 | Chainer | ............. H05K 7/20781 |
| 2017/0127549 | A1 | 5/2017 | Lunsman | |

OTHER PUBLICATIONS

PCT/US16/62076, Configurable Node Expansion Space, Nov. 15, 2016.
PCT/US16/62098, Node Blind Mate Liquid Cooling, Nov. 15, 2016.
PCT Application No. PCT/US2016/062098 International Search Report and Written Opinion dated Feb. 8, 2017.
PCT Application No. PCT/US2016/062076 International Search Report and Written Opinion dated Jan. 31, 2017.

* cited by examiner

NODE BLIND MATE LIQUID COOLING

CROSS REFERENCE TO RELATED APPLICATIONS

This application claims the priority benefit of U.S. provisional patent application No. 62/249,038 filed Oct. 30, 2015, entitled "Node Blind Mate Liquid Coupling," the disclosure of which is incorporated herein by reference. U.S. provisional patent application 62/249,024, filed on Oct. 30, 2015, entitled "Configurable Node Expansion Space," is also incorporated herein by reference into this application.

BACKGROUND OF THE INVENTION

Field of the Invention

The present invention is generally directed to systems and method for cooling electronics within a computer rack. More specifically, the present invention provides for liquid cooling of assemblies within a computer rack.

Description of the Related Art

Functionality within computing systems in the data center today is being increased. This increase in functionality frequently causes more heat generating electronic components to be included inside of computer racks that house compute blades, such as blade servers of computing equipment. Since more components are being added to computers, less space is available for air flow to cool those components. Since air flow in modern computer systems is limited and electronic components within these systems are at risk of overheating as the density of electronics in a compute blade are increased, what is needed are new methods and systems for cooling electronic components contained within computer systems and within computer racks.

SUMMARY OF THE PRESENTLY CLAIMED INVENTION

The presently claimed invention relates to systems and methods for cooling electronic components within a computer rack. A system of the presently claimed invention includes a computer rack, a node blade, and a liquid manifold that provides a cooling liquid to the node blade via liquid couplings. The node blade and liquid manifold may each include liquid couplings that allow the node blade to be connected to the liquid manifold such that leak resistant connections are formed between the liquid manifold and the node blade as the node blade is locked into the computer rack.

A method consistent with the presently claimed invention includes inserting a node blade into a computing rack and locking the node blade into the computing rack. Here again the node blade and the liquid manifold of the presently claimed invention each contain liquid couplings that provide cooling liquid to the node blade. The node blade and liquid manifold may each include liquid couplings that allow the node blade to be connected to the liquid manifold, such that resistant connections are formed between the liquid manifold and the node blade as the node blade is locked into the computer rack.

DETAILED DESCRIPTION

Figure 1:
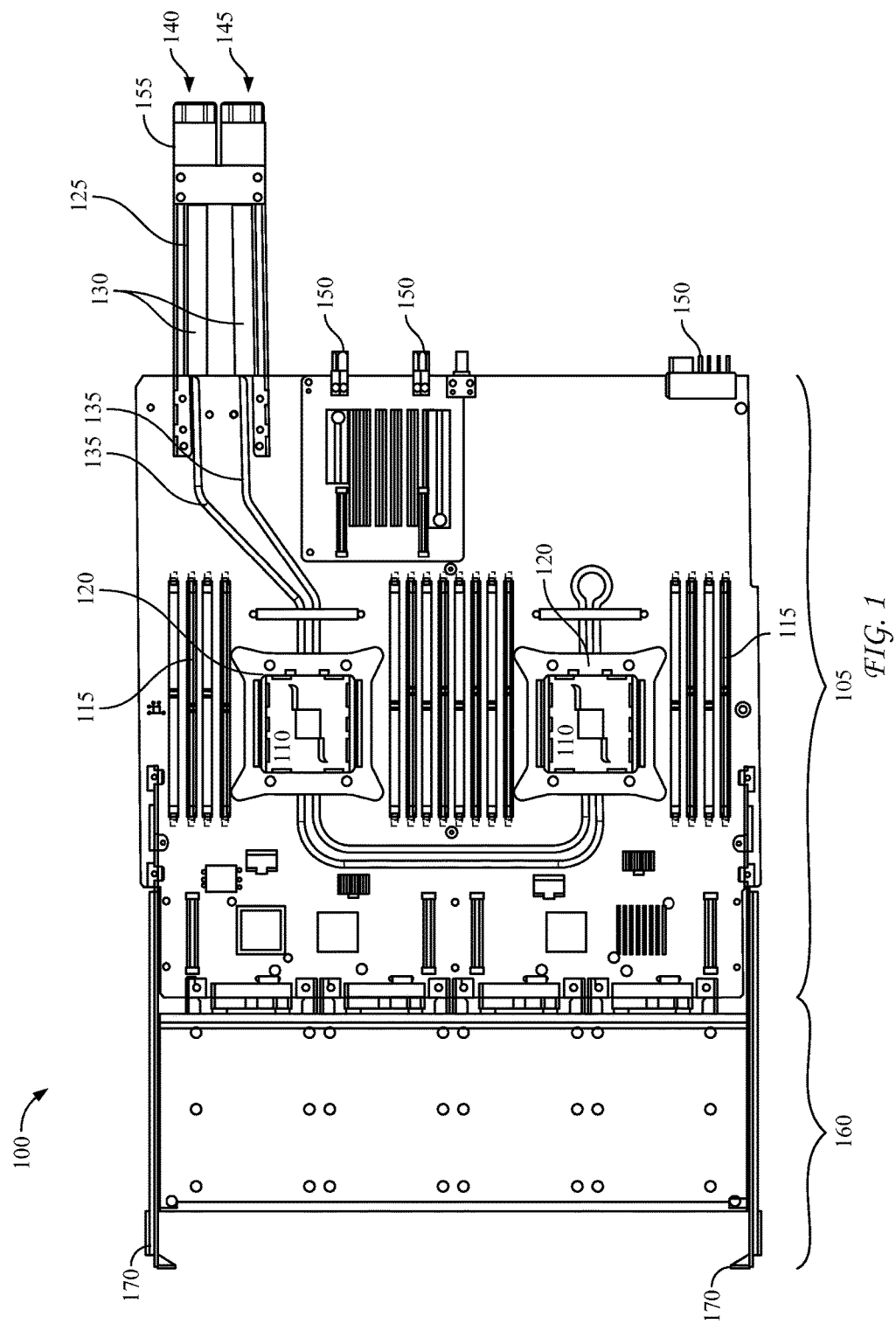
FIG. 1 illustrates an exemplary node blade consistent with the present disclosure.

Disclosed is a computer node blade or server for mounting in a computer rack and having connections for liquid cooling provided by a centralized cooling system via a blind mate connection at the rear of the blade server enclosure.

A system and method in accordance with the present invention enables high speed PCIe or other expansion routes from the processors to customer configurable devices (for example, PCIe cards, HDD, GPU, etc) without compromising the high speed interconnect fabric (for example, Omni-Path, FDR Infiniband, EDR Infiniband) or without affecting air or liquid cooling systems included in the system.

In one instance, a system and method in accordance with the present invention brings the PCIe or other expansion type routing to the front of a blade, i.e. a portion of a node blade that includes a side or edge that is exposed at a front portion of a rack when a node blade is installed in the rack. Such a front portion may be an area where service personnel of a data center access a rack or a chassis that encloses one or more node blades. The front of such a rack may include hot pluggable expansion ports/connectors where boards that enable functionality of a server/node blade to be augmented (changed) without powering down the node blade.

Node blades consistent with the present disclosure may connect to an interconnection fabric at a rear portion of a node blade. Here a rear portion of the node blade may include a side or edge of the blade that faces the rear of the rack. In such instances the rear of the rack may not be accessible without removing the blade from the rack. Liquid cooling may also be provided via a blind mate at the rear of the node blade through liquid interconnects that connect the node blade to liquid input/output ports attached to a computer rack or chassis. In certain instances, this may enable more space on the front of the blade. Liquid cooling may be brought to the front space of a node blade from the rear portion of the node blade. In such an instance, liquid conduits may allow liquid to pass from the computer rack, across a rear (i.e. a main) portion of the node blade and out to the front expansion portion of the node blade. In such an instance, the cooling may help cool high power devices housed in the front expansion space. In such instances, an interconnect fabric located at an internal portion of the rack may not be compromised or disturbed when computer boards or additional storage devices are added or removed from the front expansion portion of a node blade. As will be seen in the figures of this disclosure, this may be accomplished while a same size of a rack is maintained. As such, apparatus built in a manner consistent with the present disclosure uses space in a highly efficient manner by providing increased electronic component density in a volumetric space as compared to other apparatus.

As mentioned above liquid cooling may be supplied via the rear of a removable blade, the coupling between the cooling lines on the blade and a liquid cooling distribution system in the server rack may preferably be blind and use non-locking couplers at the point of liquid coupling. In instances where the liquid couplings are non-locking, a blade may be removed from the server rack without having to access (unlock) the liquid couplings by simply unlocking locking clips that lock the node blade into a computer rack.

Additionally, since the positioning of a blade in a server rack is generally not precise enough to accommodate the tolerance necessary to achieve a water-tight coupling, either one or both of the non-locking cooling line couplers between the blade and rack cooling lines can preferably shift laterally (i.e. move or float) with respect to the blade and/or rack. This will tend to allow couplings of the present disclosure to mate and make a water-tight alignment of the couplers even when couplings of a blade are not completely aligned with couplings attached to the rack. This floating preferably can occur without direct, manual manipulation of the couplers so that a liquid-tight coupling can occur automatically upon insertion of the node blade into the server rack. In these instances, the locking of a blade into a rack may be achieved using a mechanism at the front of the blade, such that the locking mechanism maintains a water-tight seal between blind mate couplers at the back of the blade and compatible couplers of a computer rack.

FIG. 1 illustrates an exemplary node blade consistent with the present disclosure. Node blade 100 of FIG. 1 includes expansion space 160 at a front portion of node blade 100 and a main blade portion 105 at a back portion node blade 100. When node blade 100 is plugged into a computer rack, the expansion space 160 will be at the "front" of the computer rack to allow expansion space 160 to be accessible to a user without need for removing main node blade 105 from the computer rack. Main blade portion 105 may include processors 110 and heat sinks 120 in thermal contact with processors 110. Main blade portion 105 may also include memory risers 115 and any other electronic components. Main blade portion 105 may also include electrical or optical connections 150 at the rear edge of the blade that allow node blade 100 receive data and power from other node blades or electronic components that may be operating in a computer rack. Node blade 100 also includes locking clips 170 off of top and bottom front edges of node blade 100 for removeably securing node blade 100 into a computer rack.

The extension space, such as extension space 160, of node blade 100 can include any components desired for a particular computer architecture including, yet not limited to, a hard disk drive (HDD), a solid state disk (SSD), component interconnect cards (such as Peripheral Component Interconnect Express—PCIe) cards or other types of interconnect cards, additional CPUs, GPUs (graphical processing units), RAID expanders/controllers, and/or other electronic components.

Connectors 150 may include electrical connect main blade 105 an interconnect fabric. In instances where extension 160 includes electronic components and when extension 160 is removed from or inserted into a computer rack, data or power connections on connectors 150 may not be compromised or disturbed. Even in instances where the functionality of electronic components located in extension 160 is changed, for example, when a PCIe card is installed in extension, the functionality of main node blade 105 or connectors 150 may also not be compromised or disturbed. One advantage of this approach is that the size computer rack remains the same even as its functionality is changed. In certain instances, electrical connectors connecting circuits on main node blade 105 to electronic components on extension 160 may be hot pluggable.

The presently disclosed configuration eliminates issues associated with expansion links being embedded deep within a computing enclosure where those expansion links may be available through a backplane or a mid-plane of a conventional server blade. Apparatus of the present disclosure provides connectors at a "front portion" of a blade where the expansion connectors at the front portion of the blade are only utilized when they are needed. This provides advantages to personnel of a data center as it allows for relatively greater user configurability/flexibility. When such systems are deployed in a data center, personnel of the data center will easily be able to add different types of devices to a blade. Furthermore, short path lengths between added devices and processors within a blade may be maintained. This approach also provides a way for added devices to be liquid cooled.

Node blade 100 may also include cooling line support 125 extending from a back edge thereof. Cooling line support 125 is preferably a rigid structure that supports and routes cooling lines 130. Cooling lines 130 which may be flexible hoses or pipes. The cooling lines 130 are preferably fluidly connected to blade cooling lines 135, which may also be pipes or flexible hoses. Blade cooling lines 135 may also be fluidly connected with heat sinks 120. As such, cooling liquid may be routed through voids (not depicted) in heat sinks 120. Node blade 100 cooling lines 130 are preferably connected with floating, blind-mate couplings 140 and 145 that each couple to a computer rack liquid cooling system (not shown) chiller. Preferably, cooling lines 130 and 135 are part of a single closed cooling loop on node blade 100 and include a liquid input at coupling 140 and liquid output at coupling 145. As shown in FIG. 1, node cooling line 135 may be routed only on main blade portion 105 or may be routed on both main blade portion 105 and extension space 160. FIG. 1 also includes mounting block 155 that may allow couplings 140 and 145 to be flexibly mounted, such that couplings may mate with compatible couplings in a computer rack even when a main node blade is not perfectly aligned when it is installed in the computer rack.

When liquid cooling is brought into this front space from the rear of node blade 105, the liquid cooling may extend across a main portion of the blade and out of a front portion of the main blade 105. These liquid connections may include valves that close when an assembly is not plugged into a server blade. As such, high power devices housed in an expansion space of the present disclosure may be liquid cooled using a circulating liquid. While liquid pipes or hoses are not illustrated in the extension space 160 of FIG. 1, they may be similar to the cooling lines 130 and 135 in FIG. 1. Cooling lines leading to extension space 160 may also be coupled from main blade portion 105 to extension space 160 using blind mate liquid couplings like couplings 140 and 145 of FIG. 1.

Figure 2:
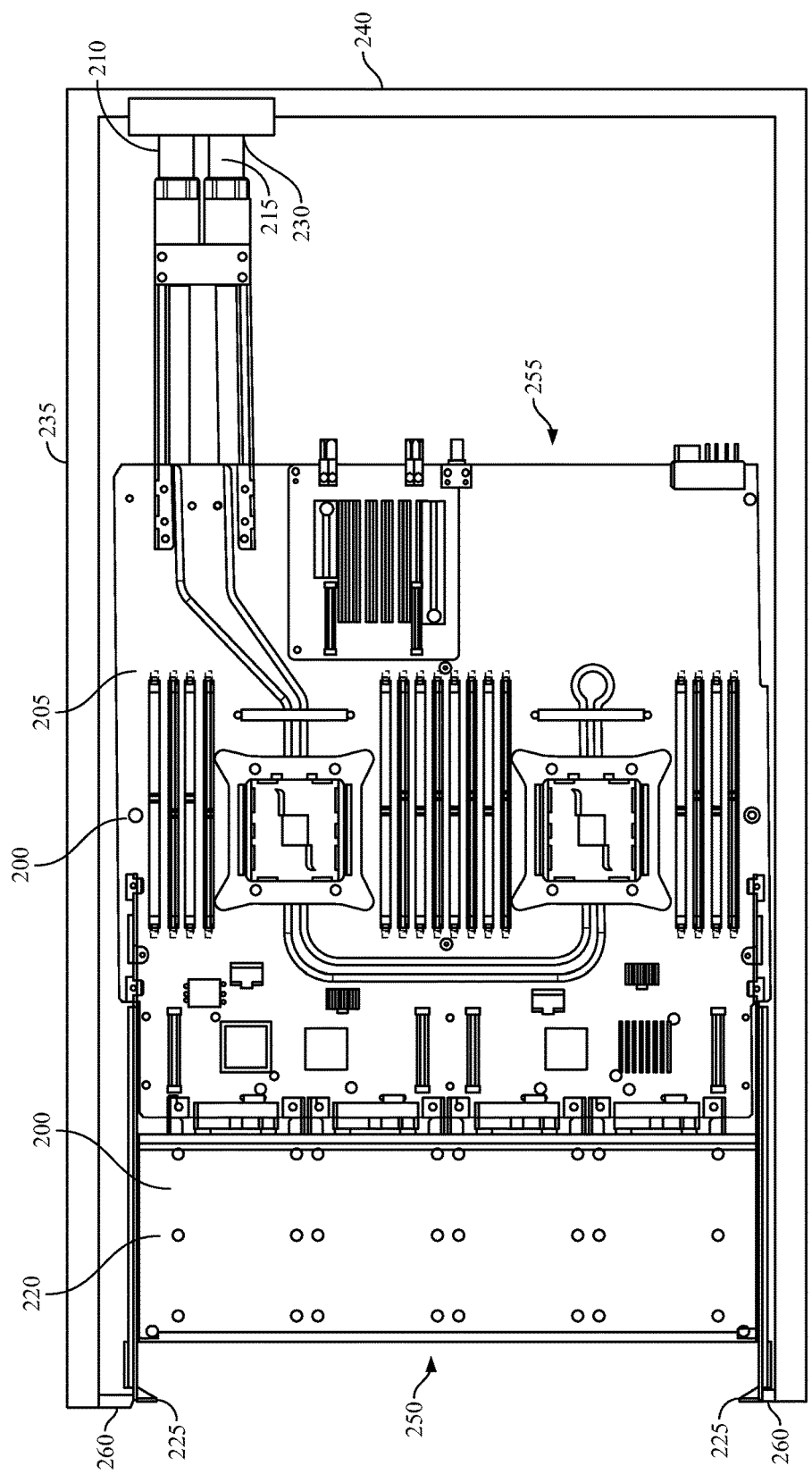
FIG. 2 illustrates a cross sectional view of a computer rack enclosure containing a node blade.

FIG. 2 illustrates a cross sectional view of a computer rack enclosure containing a node blade. FIG. 2 includes rack enclosure 235, node blade 200, cooling connections 210 &

215, and cooling distribution manifold 230. The node blade 200 of FIG. 2 includes a main node blade portion 205 and an expansion module 220. The expansion module 220 of node blade 200 is located in front part 250 of computer rack enclosure 235 and the main blade portion 205 of node blade 200 is located in a rear, less accessible, portion 240 of computer rack enclosure 235.

Liquid cooling is provided through a rear of node blade 200 directly to the main node blade 205 from enclosure 235 through cooling distribution manifold 230 and cooling connections 210 & 215. Cooling distribution manifold 230 is located at back portion 240 of rack enclosure 235. Coolant lines connecting main node blade 200 may connect with cooling manifold 230 using blind mate connectors and cooling manifold may be connected to a liquid cooling distribution system (not depicted) that connects a plurality of node blades to enclosure 235.

Since expansion module 220 is located in a front part 250 of enclosure 235, it is easily accessible to operators that maintain a data canter. When an operator wishes to modify functionality contained within the expansion portion 220 of node blade 200 they can simply open a door (not depicted) in computer chassis 235, unplug expansion module 220, and plug in a new module. In another example, main node blade 205 may be powered on and be providing services to users of the data center before expansion module 220 has been installed. Then, an operator may hot plug expansion module 220 into the main node blade 205 when adding a group of solid state drives (SSDs) to an empty expansion space of a node blade without disrupting operations performed by the node blade. Note also that main node blade portion 205 is located in a rear portion 255 of enclosure 235.

FIG. 2 also includes locking clips 225 that engage with mounting point 260 of enclosure 235 to secure node blade 200 therein. Locking clips 225 may securely lock expansion module 220 into place as it is slid into place.

Figure 3:
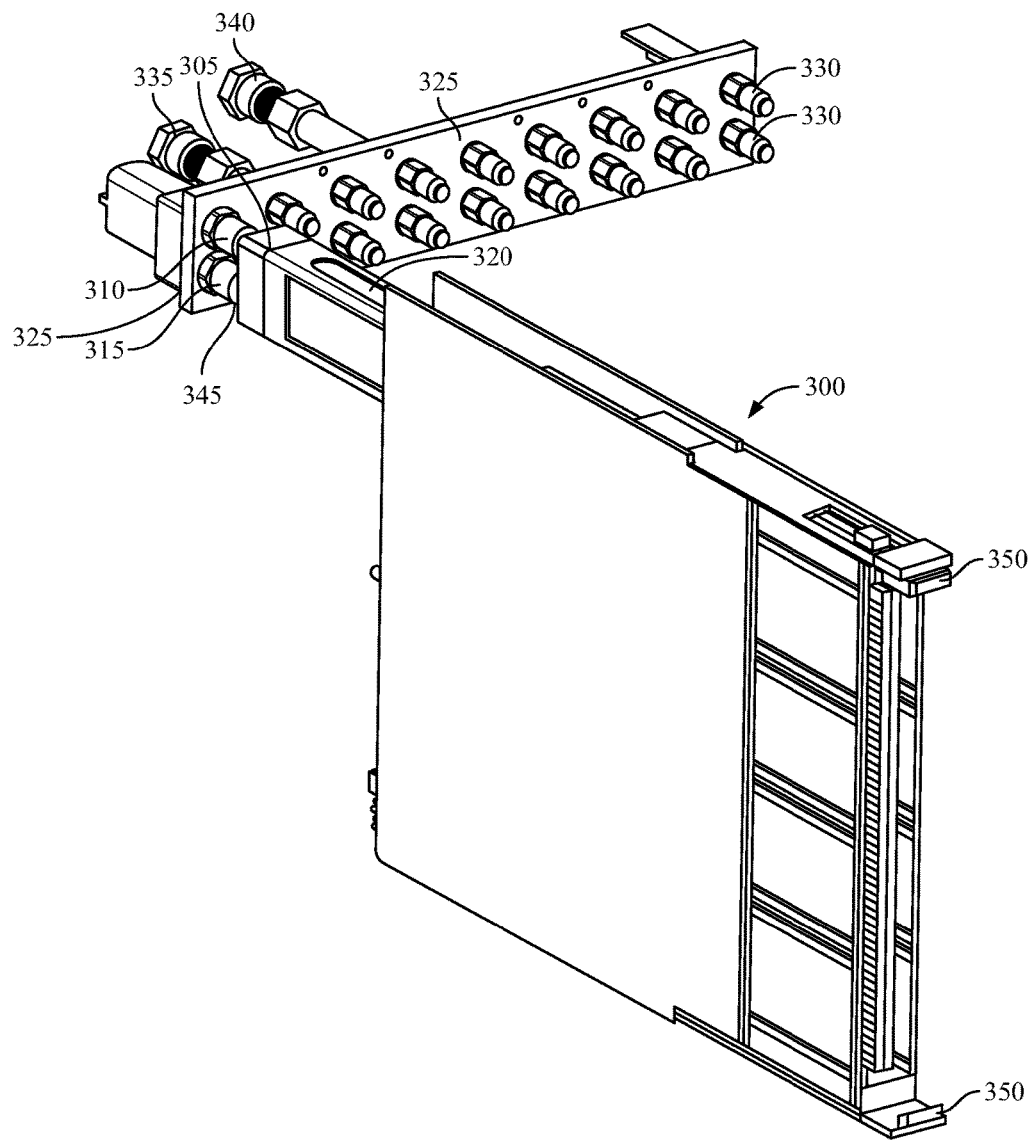
FIG. 3 illustrates an exemplary node blade connected to a liquid cooling distribution manifold.

FIG. 3 illustrates an exemplary node blade connected to a liquid cooling distribution manifold. FIG. 3 includes liquid cooling distribution manifold 325 coupled to node blade 300 by liquid couplings 330 in manifold 325 and by liquid couplings 310 and 315 of node blade 300. Note that coupler mounting block 305 is attached to cooling lines that are contained within a cooling line support structure 320. Couplings 310 and 315 are each attached to one side of mounting block 305. In the instance where couplings 310 and 315 are female liquid couplings and couplings 330 of manifold 325 are male couplings, these couplings 310 and 315 may mate with couplings 330 and 325. When couplings of this sort are flexibly mounted, a floating blade quick disconnect 345 may be formed. Floating blade quick disconnect may allow cooling lines internal to cooling line support structure to receive liquid from liquid distribution manifold 325 even in instances when liquid couplings are not perfectly aligned. Liquid distribution manifold may transport liquid to or from liquid connectors 335 and 340. Liquid connector 335, for example, may supply cooling liquid from a chiller (not depicted) and liquid connector 340 may return the cooling liquid to the chiller after the cooling liquid has cooled electronic assemblies in node blade 300. Typically, liquid distribution manifold 325 will be mounted inside of a computer rack where node blade 300 may be inserted into the computer rack. In certain instances rails or slides in a computer rack may guide node blade 300 when it is inserted into a computer rack. Node blade 300 may mate with liquid manifold connectors 330 via mounting block 305. The mating of node blade 300 with liquid manifold 325 may be performed in a "blind mate" fashion, where an operator cannot see liquid connectors 330 when node blade 300 is installed in a computer rack.

Note also that node blade 300 of FIG. 3 also includes latches 350 that may align with and connect to a computer rack in a fashion where node blade 300 is securely mounted within the computer rack.

Figure 4:
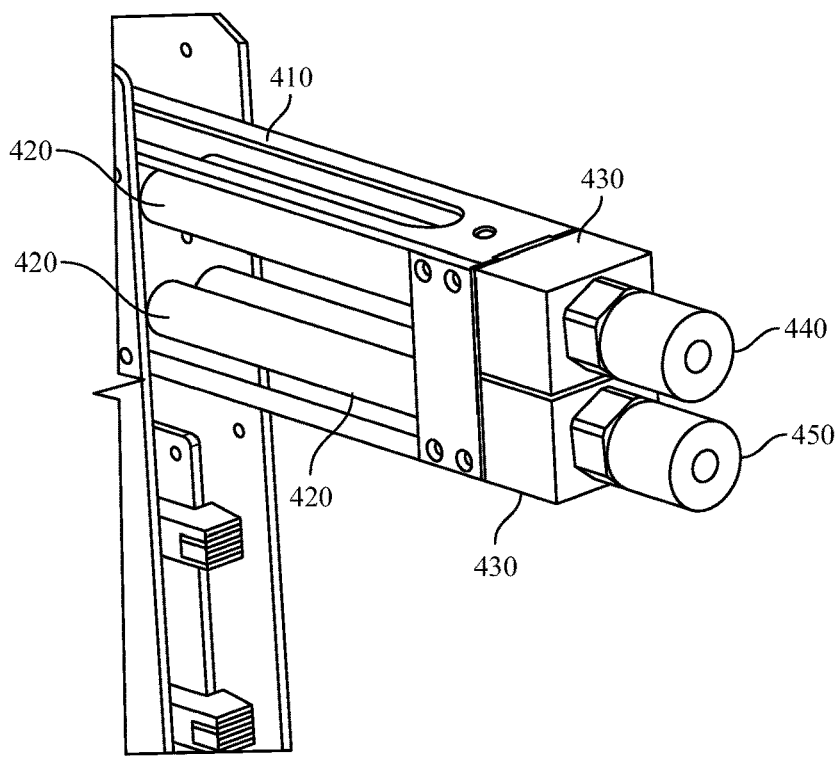
FIG. 4 illustrates a portion of a node blade that includes liquid couplings that attach a node blade to liquid supply lines in a computer rack.

FIG. 4 illustrates a portion of a node blade that includes liquid couplings that attach a node blade to liquid supply lines in a computer rack. As shown in FIG. 4, mounting blocks 430 preferably rest against an end of line support 420 distal from a node blade. Cooling lines 420 may be fabricated from elastic material (e.g. rubber hose 420), be made of a slightly compliant flexible material (e.g. plastic tubing), or be made of a more rigid material. Preferably, cooling lines 420 are sized to hold (provide a force that holds) mounting block 430 against the end of line support structure 410 such that mounting block 430 is supported. Cooling lines are also connected to liquid connectors 440 and 450. When cooling lines 420 are made from an elastic material, cooling lines 420 may be slightly stretched such that mounting block 430 is pulled back toward line support structure 410 by a force similar to a force that pulls at the ends of a stretched spring. Preferably, such a holding force that holds mounting block 430 is great enough to cause mounting blocks 430 to remain in contact with and end surface of line support structure 410, in a manner that also allows mounting blocks 430 to move laterally against the end surface of line support structure 410. Such a flexible structure may allow coolant lines to couple even when they are not perfectly aligned as in the instance discussed above in respect to floating coolant lines.

Figure 5:
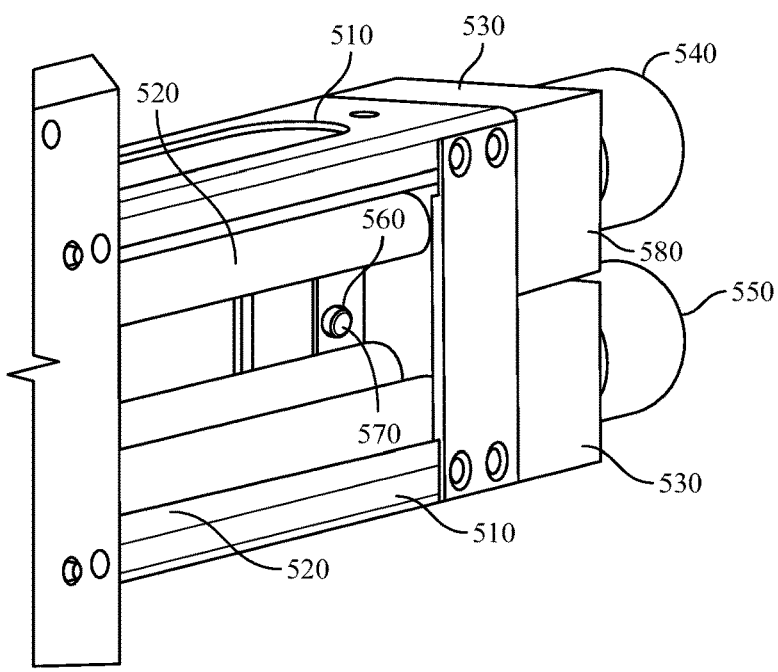
FIG. 5 also illustrates a portion of a node blade that includes liquid couplings that attach a node blade to liquid supply lines in a computer rack.

FIG. 5 also illustrates a portion of a node blade that includes liquid couplings that attach a node blade to liquid supply lines in a computer rack. The portion of the node blade illustrated in FIG. 5 depicts a different view of the node blade illustrated in FIG. 4 FIG. 5 includes cooling line support structure 510, may preferably includes a flange 580 on the end of cooling line support structure 510 distal from a node blade and perpendicular to a fluid-flow direction through cooling lines 510. A surface of mounting block 530 that is opposite to liquid couplings 530 and 540 contacts flange 580. Flange 580 preferably includes aperture 570, mounting block 530, and pin 560 that protrude through aperture 570. Though only a single aperture 570 and pin 560 is shown in FIG. 5, mounting block 530 preferably includes a plurality of pins 560 (for example two or three pins) and apertures 570 protruding from the face of each mounting block 530 that contacts flange 580. Contact flange 580 may be adjacent to the outside facing sides of each mounting block 530. Preferably, flange 580 includes a plurality of apertures 570 aligned with each pin 560 of mounting blocks 530.

Preferably there is enough space between an outer surface of pins 560 and an edge of apertures 570 to allow pins 560 to move laterally within apertures 570. This, in turn, allows mounting blocks 530 to move laterally with respect to the end of support structure 510 while maintaining contact with flange 580. This lateral movement, or floating, of mounting blocks 530 allows couplings 530 and 540 and connectors on a liquid supply manifold (like connectors 330 of manifold 325 of FIG. 3) to laterally align with each other when a node blade is inserted into a computer rack creating a liquid tight seal. Additionally, in an instance when couplings 530 and 540 form a non-locking connection, locking clips of a node blade (such as locking clips 350 of FIG. 3) may secure a node blade into a computer rack. In this way, couplings 530 and 540 remain biased against connectors in a liquid supply manifold in a longitudinal or fluid-flow direction. Furthermore, couplings 530 and 540 and/or connectors like connectors 330 of manifold 325 of FIG. 3) in a liquid supply manifold may be spring biased in a fluid-flow direction to maintain force between couplings 530 & 540 and the connectors in the liquid supply manifold.

Though floating of mounting blocks 530 is achieved through use of pins in apertures, the lateral floating of couplings 539 and 540 can be achieved in any appropriate way. Additionally, liquid connectors (like connectors 330 of manifold 325 of FIG. 3) of a liquid supply manifold may be configured to laterally float instead of, or in addition to, the lateral floating of couplings 530 and 540.

When couplings 530/540 and liquid connectors 330 of FIG. 3 are non-locking liquid connectors, they may be spring biased in a manner that forces coupling 530/540 into connectors 330 in a fluid flow direction. For example, in such an instance non-locking liquid connectors like liquid connectors provided by SMC Corporation of Noblesville, Ind. may be used.

Non-locking connectors provide the ability to remove a node blade from an enclosure without having to actuate a locking mechanism on a liquid connector. In such a configuration, liquid connectors could un-mate when the locking connectors 350 of FIG. 3 were released. When couplings 530/540 and liquid connector 330 of FIG. 3 include valves, those valves could close when a node blade was removed from a computer rack.

Figure 6:
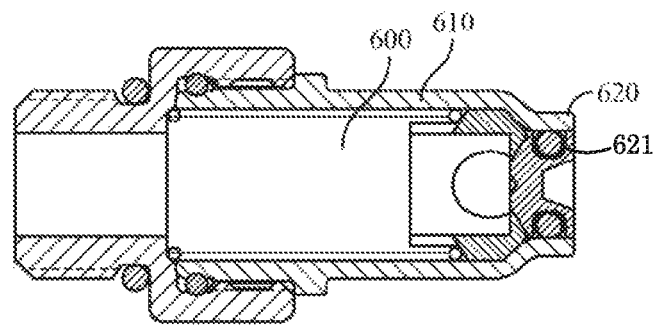
FIG. 6 illustrates a cross-sectional view of an exemplary male liquid coupling.

FIG. 6 illustrates a cross-sectional view of an exemplary male liquid coupling. Liquid coupling 600 of FIG. 6 is a male liquid coupling that includes a male portion 610 that in turn includes mounting surface 620. Liquid coupling 600 may be mounted on a liquid cooling supply manifold. Liquid coupling 600 may also be a non-locking coupling where mounting surface 620 and male portion 610 help prevent liquid transferred through coupling 600 from leaking when mounting surface 620 is biased (forced) into a compatible female coupling. Liquid coupling 600 may be the same type of liquid coupling as the liquid coupling 330 of FIG. 3

Figure 7:
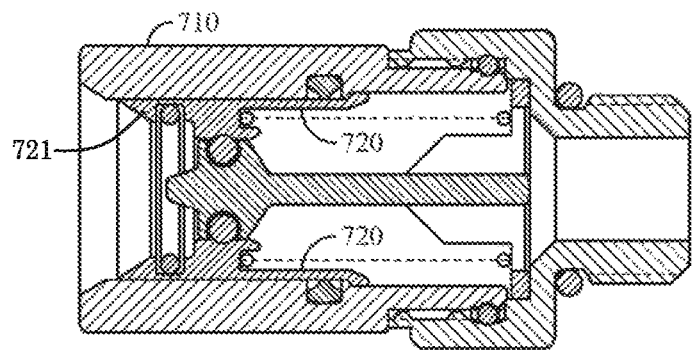
FIG. 7 illustrates a cross-sectional view of another exemplary female liquid coupling. FIG.

FIG. 7 illustrates a cross-sectional view of another exemplary female liquid coupling. FIG. 7 includes liquid coupling 700 and may be the same liquid couplings illustrated in FIGS. 3-5 that mate into liquid coupling 600 of FIG. 6 or liquid couplings 530 & 540 of FIG. 5. Liquid coupling 700 includes sleeve 710 and springs 720. The male portion 610 of liquid coupling 600 of FIG. 6 may fit into liquid the sleeve 710 of female liquid coupling 700. Springs 720 may provide a force that forces mating surface 620 of the male coupling 600 into a specific orientation that creates a liquid-tight seal when the couplings are securely coupled.

Figure 8:
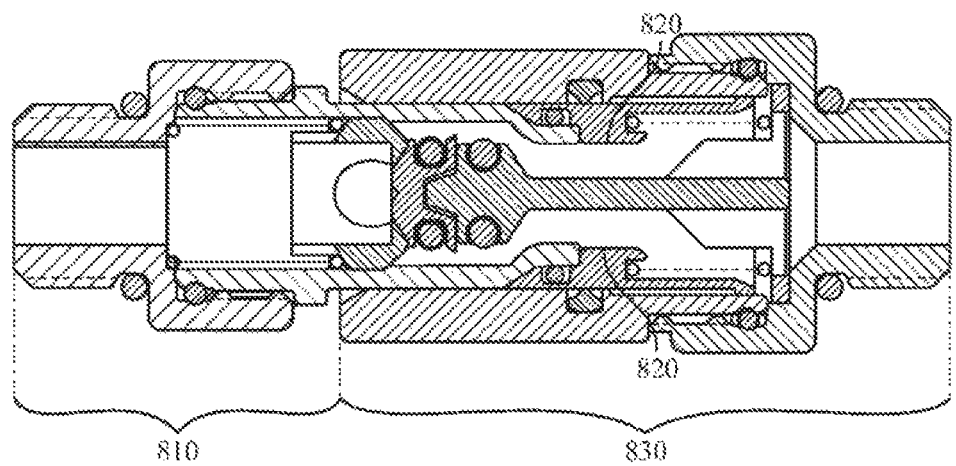
FIG. 8 illustrates a cross-sectional view of a male liquid coupling and a female liquid coupling that are connected together forming a connection that allows liquid to flow through the male and the female couplings without leaking

FIG. 8 illustrates a cross-sectional view of a male liquid coupling and a female liquid coupling that are connected together forming a connection that allows liquid to flow through the male and the female couplings without leaking. FIG. 8 includes male coupling 810 and female coupling 830. The springs 820 may be the springs 720 of FIG. 7. Note that when male coupling 810 is connected to female coupling 830, springs 820 may be compressed such that springs 820 force mating surface to form a liquid tight non-leaking seal while allowing liquid to move through couplings 810 and 830. Alternatively or additionally male couplings 720 may include springs that help create a liquid pathway through a coupling that does not leak or that resists leaking. As previously mentioned, liquid couplings of the present disclosure may include valves that close when a node blade is disconnected from a liquid supply manifold. For example, the liquid coupling 600 of FIG. 6 may include a valve 621 that is in the closed position when it is not connected to liquid coupling 700, thereby sealing off the flow of cooling liquid from or to the liquid coupling 600. In another example, the liquid coupling 700 of FIG. 7 may include a valve 721 that is in the closed position when it is not connected to liquid coupling 600, thereby sealing off the flow of cooling liquid from or to the liquid coupling 700. As illustrated in FIG. 8, such valves may be opened when the springs 820 are compressed by connecting complementary couplings, thereby allowing liquid to move between the couplings 810 and 830.

Though couplings attached to node blades in FIGS. 3-5 are illustrated as female couplings and couplings 330 of the liquid supply manifold 325 of FIG. 3 are male, a liquid supply manifold could include female couplings when node blades include male couplings.

A main node blade portion may include PCIe type expansion links that allow expansion modules to be attached to the main node blade. While the present disclosure discusses the use of PCIe expansion links, other types of expansion links may be used in a manner consistent with the present disclosure.

In certain instances, a computer server or node blade expanded by methods and apparatus consistent with the present disclosure may include a cluster interconnect fabric (like Omni-Path, Infiniband, FDR Infiniband, EDR Infiniband). Embodiments of the present disclosure enable functionality of a computer server or node blade to be expanded without disrupting a connection of the cluster interconnect fabric.

A system and method in accordance with the present invention enables high speed PCIe or other expansion routes from the processors to customer configurable devices (i.e. PCIe cards, hard disk drives—HDD, Solid State Drives—SSDs, graphical processing units—GPU, etc.) without compromising the high speed interconnect fabric (for example, Omni-Path, FDR Infiniband, EDR Infiniband) or liquid cooling, and with minimal impact on air cooling.

In this disclosure, a front side of a computer rack corresponds to a portion of a computer rack where service personnel access server blades or other components in an enclosure. A back portion of the computer rack is an internal portion of the enclosure that is opposite to the front side of the enclosure. When service personnel access the computer rack, they may do so by opening a door that is located at the front side of the computer rack. In one embodiment, an apparatus and method in accordance with the present disclosure brings the PCIe or other expansion type routing to the front of a server blade (node blade). In such embodiments, these expansion connections may be on the side or edge of a blade that is exposed at the front of a computer rack.

An apparatus of the present disclosure may also include connectors that connect to an interconnect fabric at a rear portion of the blade. In such instances, a side or edge of the blade that faces a rear or internal portion of a computing rack where these interconnect fabric connectors reside may not be accessible without removing the blade from the computer rack. Liquid cooling may also be provided via a blind mating liquid interconnect at the rear of the blade to enable more space on the front of the blade. Such blind mate interconnects may be include valves that prevent the movement of liquid when a server blade is not plugged into an enclosure. In certain instances this front space may extend out beyond an enclosure that encloses the blade.

Figure 9:
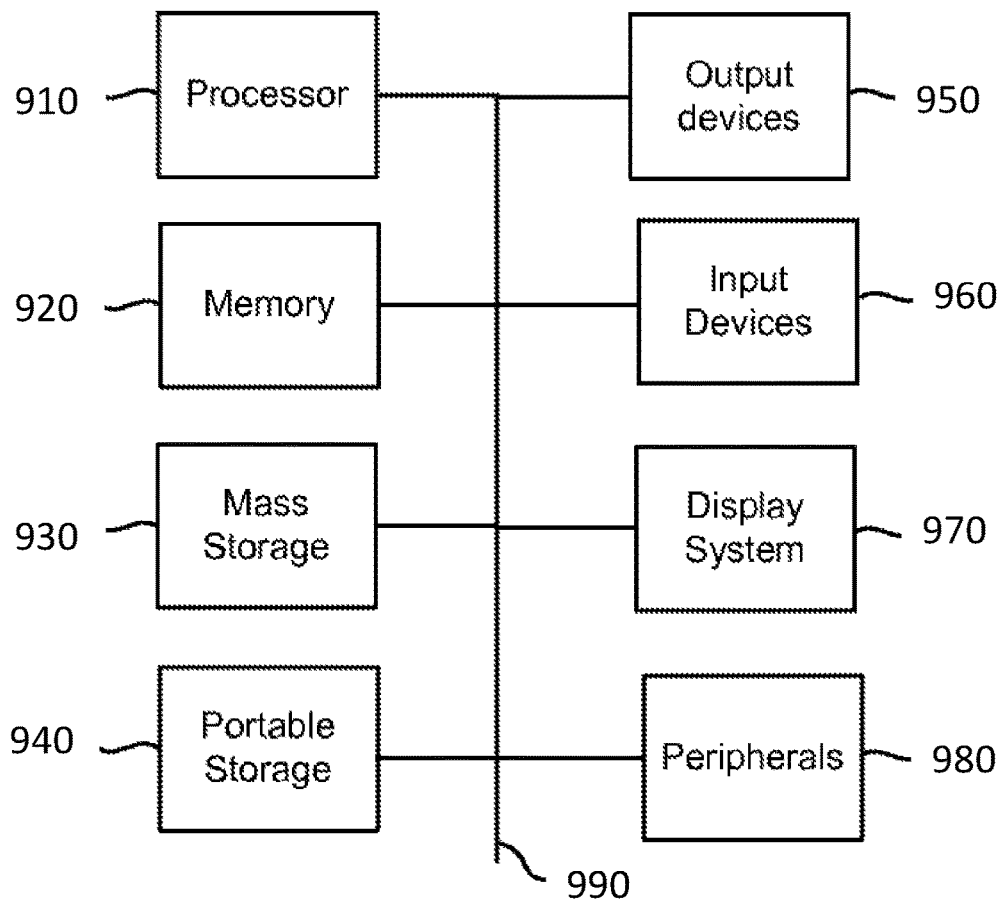
FIG. 9 illustrates an exemplary computing system that may be used to implement all or a portion of a device for use with the present technology.

FIG. 9 illustrates an exemplary computing system that may be used to implement all or a portion of a device for use with the present technology. The computing system 900 of FIG. 9 includes one or more processors 910 and memory 920. Main memory 920 stores, in part, instructions and data for execution by processor 910.

Main memory 920 can store the executable code when in operation. The system 900 of FIG. 9 further includes a mass storage device 930, portable storage medium drive(s) 940, output devices 950, user input devices 960, a graphics display 970, and peripheral devices 980. The components shown in FIG. 9 are depicted as being connected via a single bus 990. However, the components may be connected through one or more data transport means. For example, processor unit 910 and main memory 920 may be connected via a local microprocessor bus, and the mass storage device 930, peripheral device(s) 980, portable storage device 940, and display system 970 may be connected via one or more input/output (I/O) buses. Mass storage device 930, which may be implemented with a magnetic disk drive, solid state drives, an optical disk drive or other devices, may be a non-volatile storage device for storing data and instructions for use by processor unit 910. Mass storage device 930 can store the system software for implementing embodiments of the present invention for purposes of loading that software into main memory 920.

Portable storage device 940 operates in conjunction with a portable non-volatile storage medium, such as a FLASH thumb drive, compact disk or Digital video disc, to input and output data and code to and from the computer system 900 of FIG. 9. The system software for implementing embodiments of the present invention may be stored on such a portable medium and input to the computer system 900 via the portable storage device 940.

Input devices 960 provide a portion of a user interface. Input devices 960 may include an alpha-numeric keypad, such as a keyboard, for inputting alpha-numeric and other information, or a pointing device, such as a mouse, a trackball, stylus, or cursor direction keys. Additionally, the system 900 as shown in FIG. 9 includes output devices 950. Examples of suitable output devices include speakers, printers, network interfaces, and monitors.

Display system 970 may include a liquid crystal display (LCD) or other suitable display device. Display system 970 receives textual and graphical information, and processes the information for output to the display device.

Peripherals 980 may include any type of computer support device to add additional functionality to the computer system. For example, peripheral device(s) 980 may include a modem or a router.

The components contained in the computer system 900 of FIG. 9 are those typically found in computer systems that may be suitable for use with embodiments of the present invention and are intended to represent a broad category of such computer components that are well known in the art. Thus, the computer system 900 of FIG. 9 can be a personal computer, hand held computing device, telephone, mobile computing device, workstation, server, minicomputer, mainframe computer, or any other computing device. The computer can also include different bus configurations, networked platforms, multi-processor platforms, etc. Various operating systems can be used including Unix, Linux, Windows, Macintosh OS, Android, and other suitable operating systems.

Figure 10:
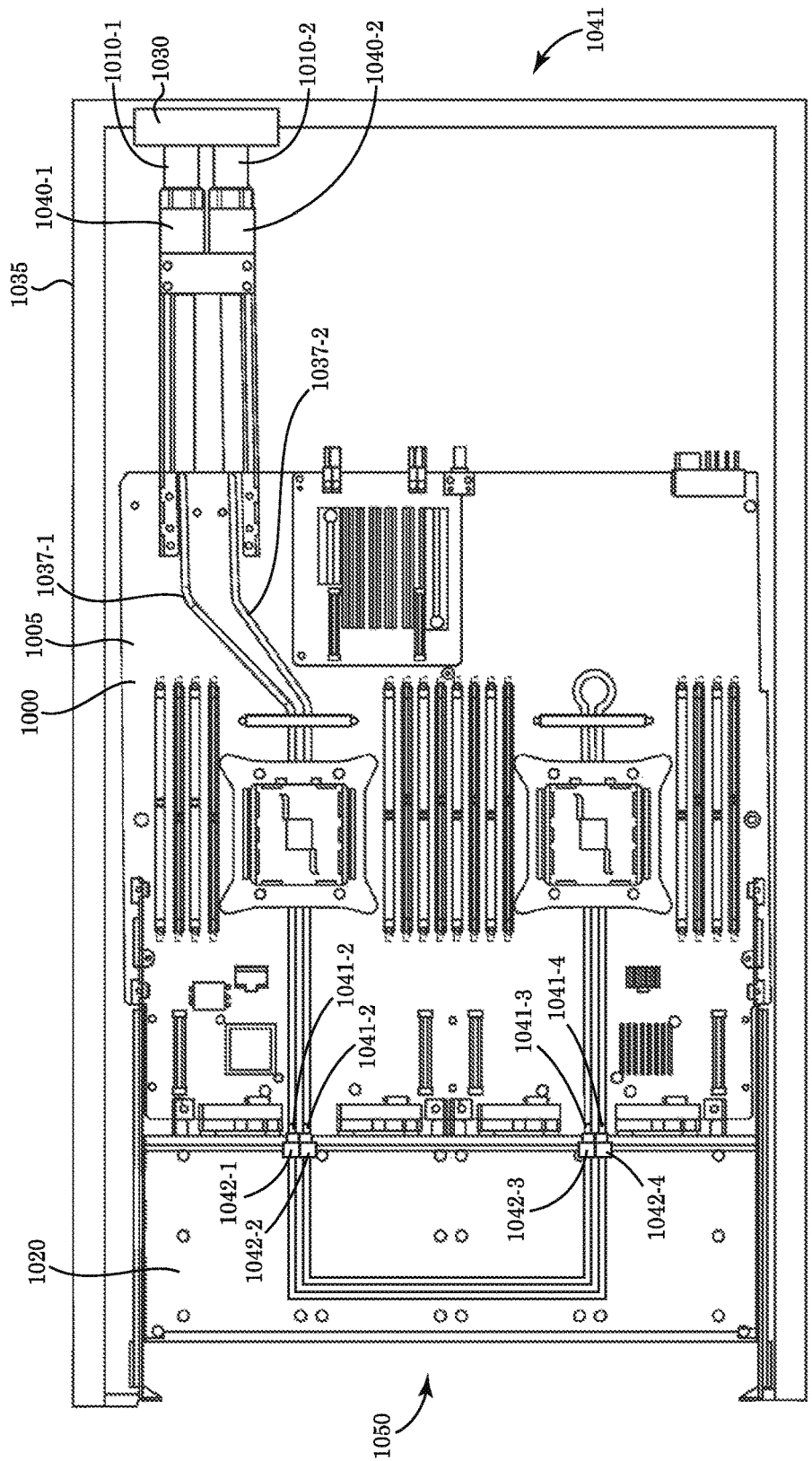
FIG. 10 illustrates an example of a computer rack enclosure containing a node blade according to the present disclosure.

FIG. 10 illustrates a cross-sectional view of an example of a computer rack enclosure 1035 containing a node blade 1000 according to the present disclosure. FIG. 10 may include a computer rack enclosure 1035, a node blade 1000, a cooling distribution manifold 1030, liquid couplings 1010-1 and 1010-2 of the cooling distribution manifold, and first liquid couplings 1040-1 and 1040-2 of the node blade 1000. The node blade 1000 of FIG. 10 may include a main blade portion 1005 and an expansion module 1020. The expansion module 1020 of node blade 1000 may be located in a front part 1050 of the computer rack enclosure 1035 and the main blade portion 1005 of the node blade 1000 may be located in a rear, less accessible, portion 1041 of the computer rack enclosure 1035.

As described above, liquid cooling may be provided through a rear of node blade 1000 directly to the main blade portion 1005 of the node blade 1000 and/or the expansion module 1020 of node blade 1000. The cooling liquid may be supplied from the enclosure 1035 through the cooling distribution manifold 1030. For example, the cooling distribution manifold 1030 may transport cooling liquid to or from a chiller. The cooling distribution manifold 1030 may transport cooling liquid to or from the first liquid couplings 1040-1 and 1040-2 of the node blade 1000 through their connection with the liquid couplings 1010-1 and 1010-2 of the cooling distribution manifold. As described in FIG. 8, a male coupling, for example liquid couplings 1010-1 and 1010-2 of the cooling distribution manifold, may connect to a female coupling, for example the first liquid couplings 1040-1 and 1040-2 of the node blade 1000, causing springs to be compressed that force mating surfaces of the aforementioned liquid couplings to form a non-leaking seal while allowing cooling liquid to move through the couplings. As such, a liquid pathway may be formed from the cooling distribution manifold into and through node cooling lines 1037-1 and 1037-2 routed on the node blade 1000.

In some examples, the location of the expansion module 1020 in the front portion 1050 of the computer rack enclosure 1035 may be easily accessible to operators that maintain a data center. As described above, the expansion module 1020 of the node blade 1000 may include various boards that enable functionality of components installed to the expansion module 1020. The expansion module 1020, as described above, may include electrical connectors and/or connecting circuits that may connect to circuits on the main blade portion 1005 of the node blade 1000 in a hot-pluggable fashion. As such, when an operator wishes to modify functionality contained within the expansion module 1020 of the node blade 1000, they can simply open a door (not depicted) in computer chassis 1035, unplug expansion module 1020, and plug in a new module.

FIG. 10 illustrates an example of node cooling lines 1037-1 and 1037-N routed on both the main blade portion 1005 of the node blade 1000 and the expansion module 1020 of node blade 1000. As described above, the node cooling lines 1037-1 and 1037-N may extend across the main blade portion 1005 of the node blade 1000 to the expansion module 1020 of node blade 1000. Further, as described above, the portion of the node cooling lines 1037-1 and 1037-N routed on the main blade portion 1005 of the node blade 1000 may be connected to the portion of the node cooling lines 1037-1 and 1037-N routed on the expansion module 1020 of node blade 1000. Furthermore, as described above the portion of the node cooling lines 1037-1 and 1037-N routed on the main blade portion 1005 of the node blade 1000 may be connected to the portion of the node cooling lines 1037-1 and 1037-N routed on the expansion module 1020 of node blade 1000 via blind mate liquid couplings like couplings 140 and 145 of FIG. 1. For example, the portion of the node cooling lines 1037-1 and 1037-N routed on the main blade portion 1005 of the node blade 1000 may be connected to the portion of the node cooling lines 1037-1 and 1037-N routed on the expansion module 1020 of node blade 1000 via a connection between a second liquid coupling 1041-1 . . . 1041-4 of the node blade 1000 and a third liquid coupling 1042-1 . . . 1042-4 of the node blade 1000. The second liquid coupling 1041-1 . . . 1041-4 of the node blade 1000 and a third liquid coupling 1042-1 . . . 1042-4 of the node blade 1000 may be complementary male or female couplings such as those described above with respect to FIG. 8. Although, FIG. 10 illustrates four such second liquid couplings 1041-1 . . . 1041-4 and four such third liquid coupling 1042-1 . . . 1042-4, other amounts of a liquid couplings may be utilized.

The second liquid coupling 1041-1 . . . 1041-4 of the node blade 1000 and a third liquid coupling 1042-1 . . . 1042-4 of the node blade 1000 may be blind mated. Cooling liquid may be transported to and/or from the portion of the node cooling lines 1037-1 and 1037-N routed on the expansion module 1020 of node blade 1000 through the second liquid coupling 1041-1 . . . 1041-4 of the node blade 1000 and the third liquid coupling 1042-1 . . . 1042-4 of the node blade 1000. For example, as described in FIG. 8, a male coupling, for example second liquid coupling 1041-1 . . . 1041-4 of the node blade 1000, may connect to a female coupling, for example the third liquid coupling 1042-1 . . . 1042-4 of the node blade 1000, causing springs to be compressed that force mating surfaces of the second liquid coupling 1041-1 . . . 1041-4 and the third liquid coupling 1042-1 . . . 1042-4 to form a non-leaking seal while allowing cooling liquid to move through the couplings. As such, a liquid pathway may be formed from the cooling distribution manifold into and through node cooling lines 1037-1 and 1037-2 routed on the blade portion 1005 of the node blade 1000 and the expansion module 1020 of node blade 1000.

The foregoing detailed description of the technology herein has been presented for purposes of illustration and description. It is not intended to be exhaustive or to limit the technology to the precise form disclosed. Many modifications and variations are possible in light of the above teaching. The described embodiments were chosen in order to best explain the principles of the technology and its practical application to thereby enable others skilled in the art to best utilize the technology in various embodiments and with various modifications as are suited to the particular use contemplated. It is intended that the scope of the technology be defined by the claims appended hereto.

What is claimed is:

1. A system comprising:
   a computer rack;
   a distribution manifold configured to distribute a cooling liquid into each node blade of a plurality of node blades in the computer rack connected to the distribution manifold, wherein the distribution manifold includes a plurality of distribution manifold liquid couplings;
   a node blade including:
      a main portion, and
      a first plurality of node blade liquid couplings configured to engage with the plurality of distribution manifold liquid couplings, thereby enabling fluid communication between the distribution manifold and a node blade cooling line, as the node blade is installed into the computer rack;
   a removeable expansion module configured to be connected to the main portion of the node blade by a plurality of expansion module liquid couplings, thereby establishing fluid communication between the node blade cooling line and an expansion module cooling line providing cooling to an electronic device of the removable expansion module.

2. The system of claim 1, further comprising locking clips that lock the node blade into the computer rack when the node blade is installed into the computer rack.

3. The system of claim 2, wherein the first plurality of node blade liquid couplings and the plurality of distribution manifold liquid couplings are non-locking, and the locking-clips provide a force that holds the first plurality of node blade liquid couplings and the plurality of distribution manifold liquid couplings together when the node blade is locked into the computer rack.

4. The system of claim 3, wherein the force that holds the first plurality of node blade liquid couplings and the plurality of distribution manifold liquid couplings together is released when the node blade is unlocked from the computer rack, and the node blade is unlocked from the computer rack by the locking clips.

5. The system of claim 1, wherein a first coupling of the plurality of distribution manifold liquid couplings engaged with a first coupling of the first plurality of node blade liquid couplings provides the cooling liquid to the node blade cooling line from a chiller.

6. The system of claim 5, wherein a second coupling of the plurality of distribution manifold liquid couplings engaged with a second coupling of the first plurality of node blade liquid couplings returns the cooling liquid from the node blade cooling line to the chiller.

7. The system of claim 1, wherein a supply of the liquid cooling is supplied between the main portion of the node blade to the removable expansion module via the expansion module liquid couplings connecting the main portion of the node blade to the removable expansion module.

8. The system of claim 1, wherein the first plurality of node blade liquid couplings is flexibly attached to the node blade such that the first plurality of node blade liquid couplings is moveable laterally relative to a cooling line support structure attached to the node blade.

9. The system of claim 1, wherein the first plurality of node blade liquid couplings includes valves that close when the node blade is removed from the computer rack.

10. The system of claim 1 wherein the plurality of distribution manifold liquid couplings includes valves that close when the node blade is removed from the computer rack.

11. An apparatus, comprising:
   a distribution manifold configured to distribute a cooling liquid into a node blade cooling line of each of a plurality of node blades in a computer rack, wherein the distribution manifold includes a plurality of distribution manifold liquid couplings;
   a node blade including:
      a main portion,
      a first plurality of node blade liquid couplings configured to engage with the plurality of distribution manifold liquid couplings, thereby enabling fluid communication between the distribution manifold and a node blade cooling line providing cooling to an electronic device of the node blade, as the node blade is installed into the computer rack, wherein at least one of the plurality of distribution manifold liquid couplings and the first plurality of node blade fluid couplings is a floating coupling,
      a second plurality of node blade liquid couplings configured to engage with a plurality of expansion module liquid couplings, thereby establishing fluid communication between the node blade cooling line and an expansion module cooling line providing cooling to an electronic device of a removable expansion module; and the removeable expansion module configured to be connected to the main portion of the node blade by the plurality of expansion module liquid couplings.

12. The apparatus of claim 11, wherein a first liquid coupling of the plurality of distribution manifold liquid couplings engaged with a first liquid coupling of the first plurality of node blade liquid couplings forms a floating connection providing the cooling liquid to the node blade cooling line from a chiller through the distribution manifold.

13. The apparatus of claim 12, wherein a second liquid coupling of the plurality of distribution manifold liquid couplings engaged with a second liquid coupling of the first plurality of node blade liquid couplings forms a floating connection returning the cooling liquid from the node blade cooling line back to the chiller through the distribution manifold.

14. The apparatus of claim 11, wherein a portion of the node blade cooling line passes through a cooling line support structure attached to the node blade and wherein the portion of the node blade cooling line is a flexible material configured allow the first plurality of floating node blade liquid couplings to shift laterally relative to the cooling line support structure to obtain alignment with the plurality of distribution manifold liquid couplings.

15. The apparatus of claim 14 including a mounting block, encompassing the node blade cooling line, held in contact with an end surface of the cooling line support structure by an elastic force exerted by the flexible material portion of the cooling line, wherein the mounting block is moveable laterally against the end surface of the line support structure.

16. A system, comprising:

a distribution manifold configured to distribute a cooling liquid through a node blade in a computer rack, wherein the distribution manifold includes first liquid couplings configured to engage with second liquid couplings of a node blade, thereby establishing fluid communication between the liquid distribution manifold and a cooling line of the node blade;

the node blade including:

the second liquid couplings flexibly attached to the node blade such that the second liquid couplings are moveable laterally relative to a cooling line support structure of the node blade as the node blade is installed into the computer rack, and third liquid couplings configured to engage with fourth liquid couplings of a removable expansion module, thereby establishing fluid communication between the cooling line of the node blade and a cooling line of the expansion module; and the removable expansion module including the fourth liquid couplings.

17. The system of claim 16, wherein the first liquid couplings are flexibly attached to the distribution manifold such that the first liquid couplings are moveable laterally relative to the distribution manifold as the node blade is installed into the computer rack.

18. The system of claim 16, including mounting blocks between the second liquid couplings and the cooling line support structure.

19. The system of claim 18, wherein the mounting blocks are moveable laterally relative to the cooling line support structure of the node blade and maintain contact with a portion of the cooling line support structure during the lateral movement of the mounting blocks.

20. The system of claim 18, wherein a portion of the cooling line spans within the cooling line support structure between the node blade and the second liquid couplings.

* * * * *